United States Patent
Styczinski

(12) 
(10) Patent No.: US 6,397,348 B1
(45) Date of Patent: May 28, 2002

(54) REDUNDANT ARRAY OF DISK DRIVES WITH ASYMMETRIC MIRRORING AND ASYMMETRIC MIRRORING DATA PROCESSING METHOD

(75) Inventor: David A. Styczinski, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 1389 days.

(21) Appl. No.: 08/685,269

(22) Filed: Jul. 23, 1996

Related U.S. Application Data

(63) Continuation of application No. 08/321,946, filed on Oct. 12, 1994, now abandoned.

(51) Int. Cl.[7] .............................................. G06F 11/08
(52) U.S. Cl. .......................................... 714/6; 711/114
(58) Field of Search ........................ 395/182.04, 182.05; 371/40.1; 714/6, 7; 707/202; 711/114

(56) References Cited

U.S. PATENT DOCUMENTS

| | | | |
|---|---|---|---|
| 4,959,774 A | | 9/1990 | Davis |
| 5,086,502 A | | 2/1992 | Malcolm |
| 5,155,845 A | * | 10/1992 | Beal et al. .............. 395/182.04 |
| 5,239,640 A | | 8/1993 | Froemke et al. |
| 5,255,270 A | | 10/1993 | Yanai et al. |
| 5,274,799 A | * | 12/1993 | Brant et al. ............. 395/182.04 |
| 5,297,258 A | | 3/1994 | Hale et al. |
| 5,341,381 A | * | 8/1994 | Fuller ..................... 395/182.04 |
| 5,367,669 A | * | 11/1994 | Holland et al. ......... 395/182.05 |
| 5,392,244 A | * | 2/1995 | Jacobson et al. ............ 395/441 |
| 5,404,500 A | * | 4/1995 | Legvold et al. ........ 395/182.04 |
| 5,418,921 A | * | 5/1995 | Cortney et al. ............. 395/441 |
| 5,432,922 A | * | 7/1995 | Polyzois et al. |
| 5,448,719 A | * | 9/1995 | Schultz et al. ......... 395/182.03 |

FOREIGN PATENT DOCUMENTS

| | | | |
|---|---|---|---|
| EP | A0570168 | 11/1993 | |
| EP | A0573308 | 12/1993 | |
| JP | 06139027 | 5/1994 | ............. G06F/3/06 |

OTHER PUBLICATIONS

Computer Technology Review, vol. 10, No. 16, Jan. 1991, pp. 44–47, XP000204576, Peterson, D.C., "Redundant Disk Arrays Enhance Data Safety to Support Network Servers".
IBM Technical Disclosure Bulletin, vol. 33, No. 4, Sep. 1990, p. 33/34, XP000124467, "Selecting Mirrored Disk Unit for Read Operations".

* cited by examiner

*Primary Examiner*—Scott T. Baderman
(74) *Attorney, Agent, or Firm*—Joan Pennington

(57) ABSTRACT

Apparatus and a method are provided for processing data in data processing system including a redundant array of independent disk drives (RAID) operatively controlled by an array controller. A plurality of data drives and a predefined mirror drive are provided by the RAID. The predefined mirror drive has a set capacity substantially greater than a capacity of each of the plurality of data drives. Data is written to and read from the multiple data drives in the RAID. A mirror copy of the data is written on a predefined mirror drive in the RAID.

12 Claims, 7 Drawing Sheets

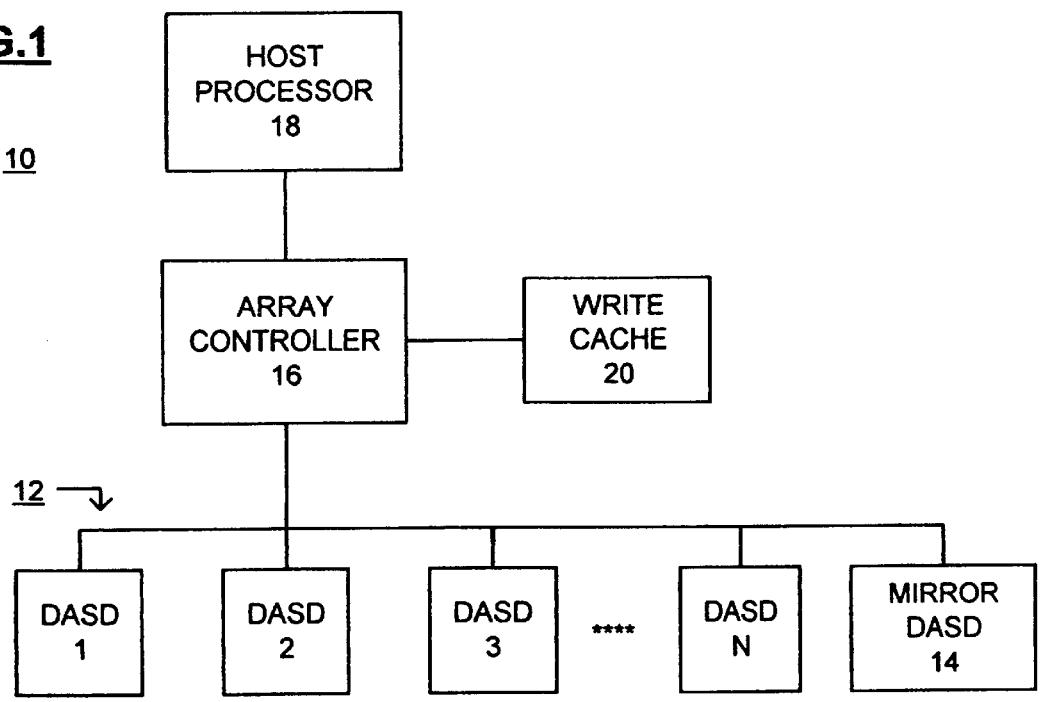

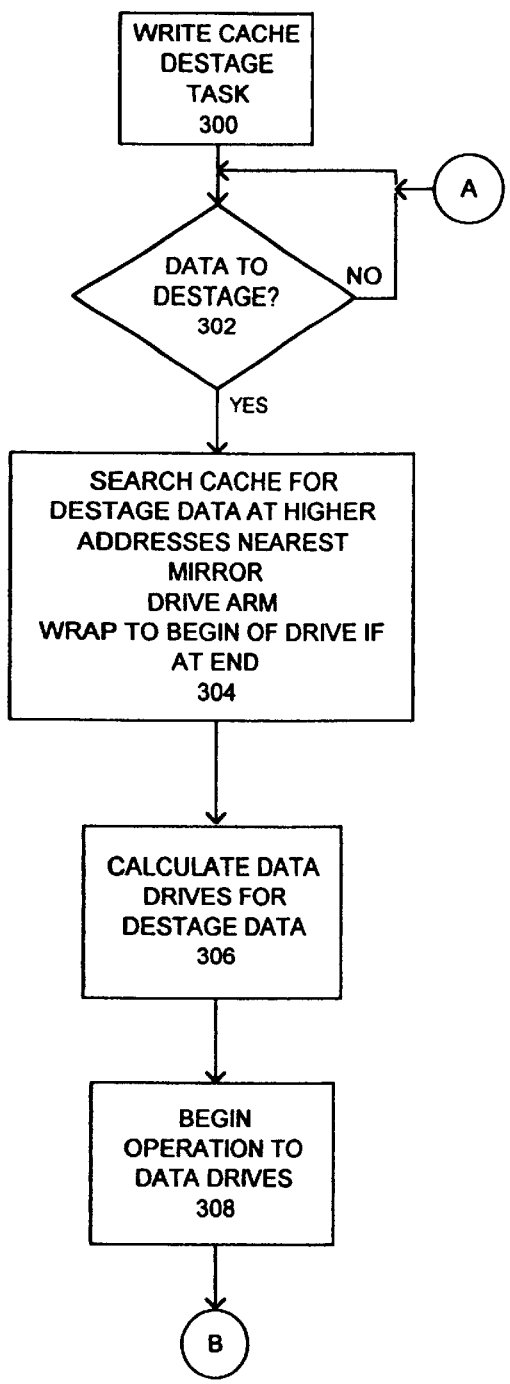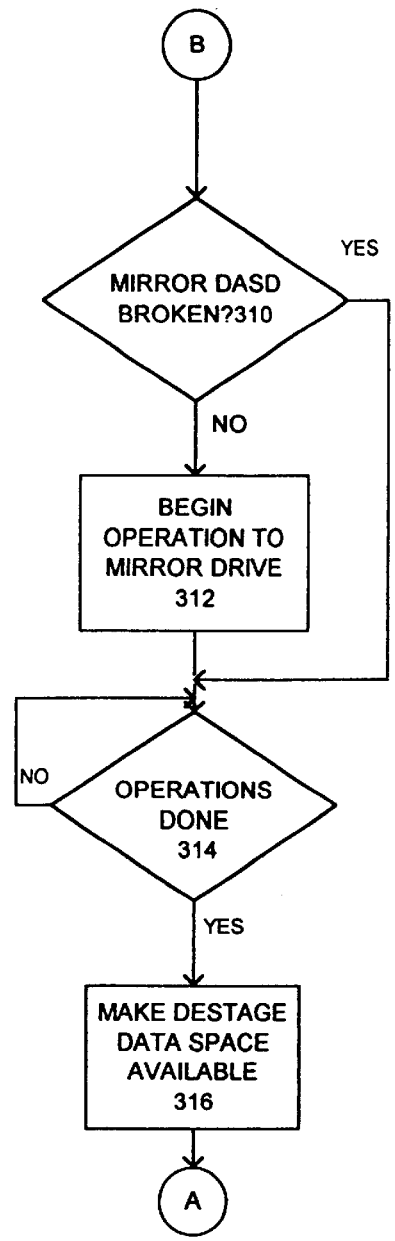
FIG.3A
FIG.3B

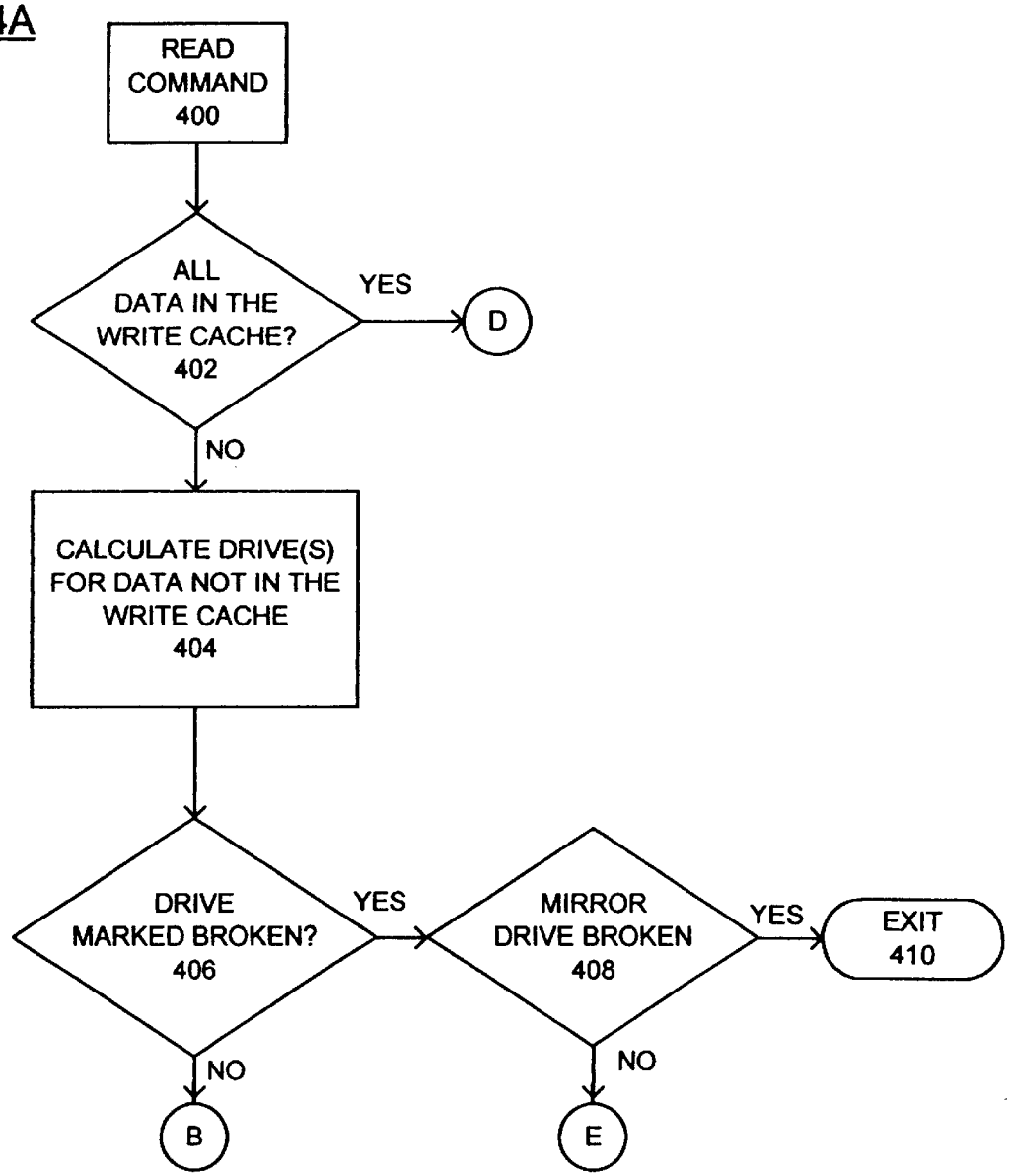

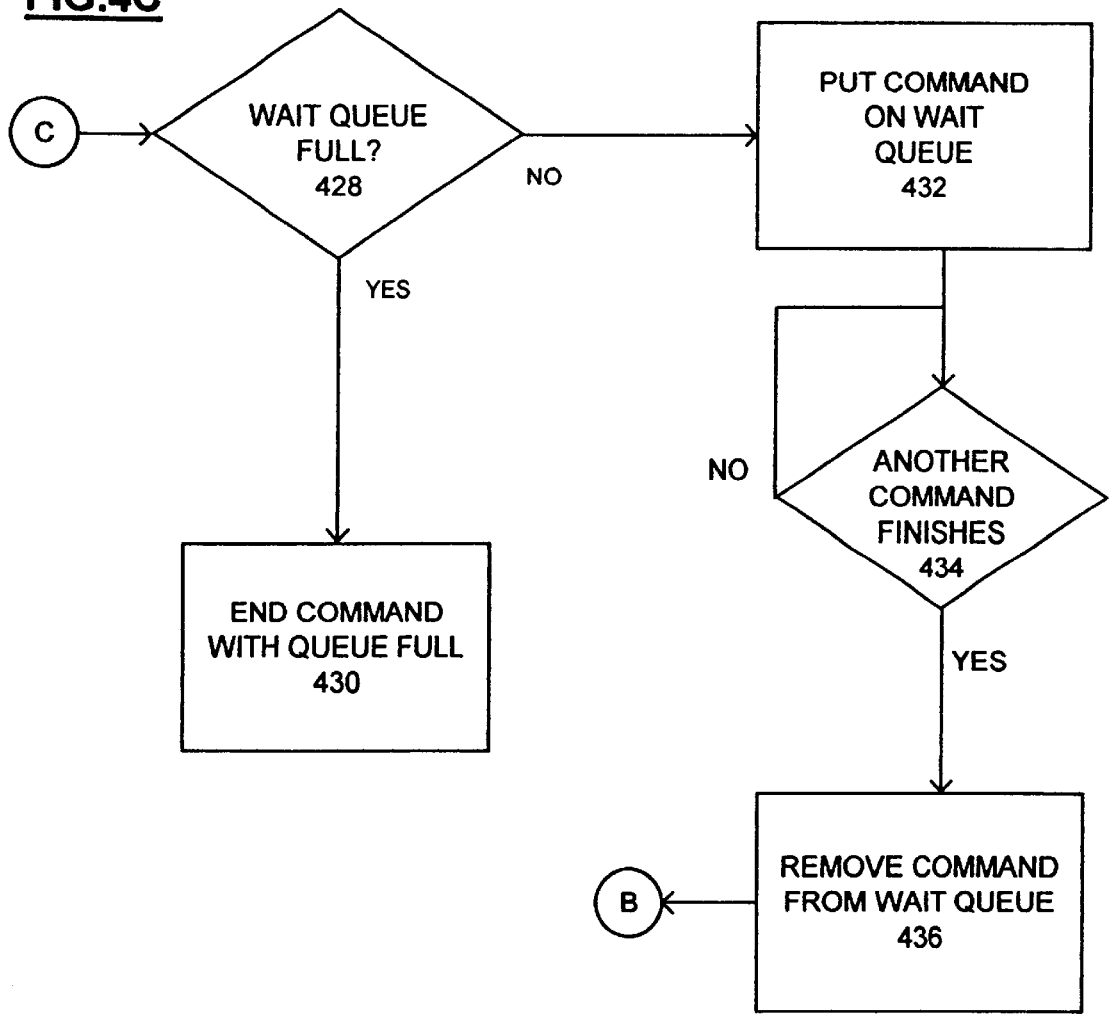

REDUNDANT ARRAY OF DISK DRIVES WITH ASYMMETRIC MIRRORING AND ASYMMETRIC MIRRORING DATA PROCESSING METHOD

This application is a continuation of application Ser. No. 08/321,946 filed Oct. 12, 1994, now abandoned.

BACKGROUND OF THE INVENTION

1. Field of the Invention

The present invention relates generally to a data processing system including a redundant array of disk drives and more particularly to a method and apparatus for processing data in a redundant array of independent disk drives (RAID) using asymmetric mirroring.

2. Description of the Prior Art

Various types of storage units, such as direct access storage devices (DASDs) are used to store data for known data processing systems. One often used type of DASD is a magnetic disk unit including a number of disks having surfaces with magnetic active material onto which data is written and from which data is read by magnetic read/write heads. In other types of DASDs, optical or other data storage media may be employed.

In a magnetic disk unit, the disks are formatted to define sectors and tracks upon the disk surfaces. Tracks are usually circular regions coaxial with the disk axis where data may be written, and sectors are parts of the tracks capable of storing a predetermined quantity of data written to the disk. Axially aligned tracks on the disks of a DASD are referred to as cylinders. The sectors of a DASD where blocks of data are stored have unique physical data block addresses (DBA). The disks of the DASD spin in unison around a common axis, and the read/white heads, usually one for each surface, are moved radially in unison across the disk surfaces. When data is read from or written to a physical DBA, the heads are moved into alignment with the cylinder containing the track in which the DBA is found, and the data transfer takes place as the sector or sectors of the DBA spin under the head.

Important considerations in the design and use of DASDs are capacity, speed of data transfer and reliability. For reasons including those discussed in Patterson et al., A Case for Redundant Arrays of Inexpensive Disks (RAID)", ACM SIGMOD Conference, Chicago, Ill., Jun. 1–3, 1988, increasing performance levels attained by central processing units (CPUs) and system memory in data processing systems result in the need for larger and faster data storage systems. To achieve these goals of capacity and speed, arrays containing a number of DASDs have been used for data storage.

In a redundant array of independent disk drives (RAID), various modes of operation have been employed to effect reliability. In a RAID type 5 subsystem, a parity based correction is used. The array may include a number of N+1 DASDs. Blocks of data called stripes typically ranging from several sectors to a full DASD track are written on N of the DASDs. A parity block is formed by calculating the exclusive-or (XOR) of the N data blocks and storing this parity block on the remaining one of the N+1 DASDs in the array. The parity fields of the array are spread across all N+1 DASDs in the array. For each set of N blocks of data that are protected by a parity block, the location of the data and parity blocks is varied in a manner that distributes the parity blocks evenly across all DASDs in the RAID type 5 architecture.

A performance problem with the RAID type 5 subsystem known as the write penalty is due to the necessity to perform a minimum of four DASD operations for each host write operation to the array. Each data update requires reading the old data, writing the new data, reading the old parity data, XORing together the old data, new data and the old parity data to generate new parity data and writing the new parity data. System speed is impaired by the read, modify and write sequence.

In another array arrangement, backup or mirror devices have been used to provide data protection. With a RAID type 1 subsystem, a duplicate set of mirror storage units are used for storing a duplicate copy of all data on each pair of storage units. In the conventional mirroring RAID type 1 subsystem, there are at least two write operation per host write operation. Each data update requires writing the data to a data DASD and writing a copy of a mirrored DASD. While mirrored RAID type 1 subsystem provides high reliability, a disadvantage is the expense of the DASD devices required for duplicate data storage.

SUMMARY OF THE INVENTION

It is a principal object of the present invention to provide an apparatus and efficient method for processing data using a redundant array of independent disk drives (RAID) that overcomes many of the disadvantages of prior art arrangements. Another important object of the invention is to provide such apparatus and method that is efficient in the use of DASD resources minimizing read/write overhead activity to the DASDs in the array while providing data protection and cost benefit.

In brief, the objects and advantages of the present invention are achieved by apparatus and a method for processing data in data processing system including a redundant array of independent disk drives (RAID) operatively controlled by an array controller. A plurality of data drives and a predefined mirror drive are included in the RAID. The predefined mirror drive has a set capacity substantially greater than a capacity of each of the plurality of data drives. Data is written to and read from the multiple data drives in the RAID. A mirror copy of the data written on the multiple data drive is written on the predefined mirror drive in the RAID. A write cache is used with the array controller for temporary storage of host data to equalize system performance.

BRIEF DESCRIPTION OF THE DRAWING

The present invention together with the above and other objects and advantages may best be understood from the following detailed description of the preferred embodiment of the invention illustrated in the drawings, wherein:

FIG. 1 is a schematic and block diagram of a data processing system including a redundant array of disk drives employing the present invention;

FIGS. 3A and 3B together provide a machine operations chart illustrating a write cache destage task data processing sequence in accordance with the invention; and FIGS. 4A, 4B and 4C together provide a machine operations chart illustrating a read command data processing sequence in accordance with the invention.

DETAILED DESCRIPTION OF THE PREFERRED EMBODIMENTS

Figure 2A:
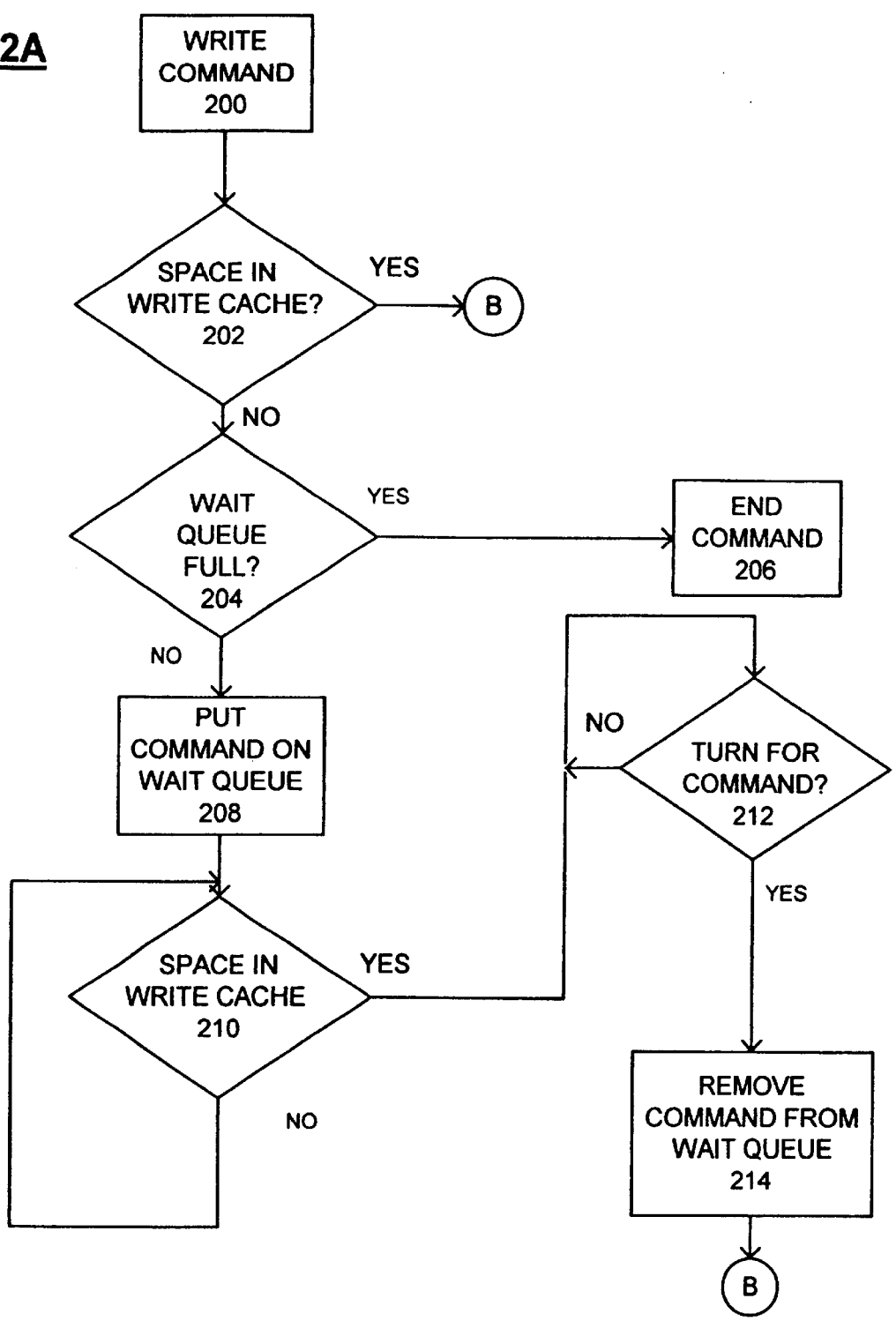
FIGS. 2A and 2B together provide a machine operating chart illustrating a write command data processing sequence in accordance with the invention.

Referring now to FIG. 1 of the drawing, there is shown a data processing system generally designated as 10 embodying the present invention and in which the asymmetric mirroring data processing method of the present invention may be carried out. The data processing system 10 includes a redundant array of independent drives (RAID) generally designated as 12. RAID 12 includes a plurality of direct access storage devices (DASDs) 1–N and at least one mirror DASD 14 controlled by an array controller 16. One or more host processors 18 is coupled to the array controller 16. A write cache 20 is used in conjunction with the array controller 16 for temporarily storing data to be written to the RAID 12.

The present invention provides an apparatus and method for processing data utilizing the asymmetric mirror RAID 12 arranged for minimizing read/write overhead activity to the DASDs 1–N and the mirror DASD 14 for efficient use of the DASDs' resources. In the asymmetric mirror RAID 12, the DASDs 1–N are defined as data DASDs and store host addressable data and the mirror DASD 14 stores mirror copies of data stored by the DASDs 1–N.

Array controller 16 is suitably programmed to perform the sequential machine operations of the invention as illustrated in FIGS. 2A, 2B, 3A, 3B, 4A, 4B and 4C. Array controller 14 provides access to the DASDs 1–N and mirror DASD 14 in the array 12; provides logical to physical address conversion for each DASD 1–N and mirror DASD 14 in the array 12 and issues all commands, such as read and write, to access the DASDs 1–N and mirror DASD 14 in the array 12.

In the preferred embodiment of the invention, the mirror DASD 14 has a selected data storage capacity much greater than the storage capacity of each of the data DASDs 1–N. For example, mirror DASD 14 can have a data storage capacity greater than or equal to the sum of the storage capacity of all of the DASDs 1–N in the RAID 12. RAID 12 is cost effective as compared to other conventional arrangements because the cost per gigabyte of storage of the mirror DASD 14 is less than the cost per gigabyte of storage of the smaller data DASDs 1–N.

Data processing system 10 advantageously is arranged so that the asymmetric mirror array 12 is utilized without a write penalty and with desirable efficiency. Data is protected by maintaining a copy in the mirror DASD 14 so that parity data blocks are not required. Since there are no parity writes to the data DASDs 1–N and the mirror DASD 14 in the asymmetric mirror RAID 12, the write penalty has been eliminated as compared to a RAID type 5 subsystem.

In operation, array controller 16 applies a stream of t data operations per second to the asymmetric mirror array 12. A proportion w of the t data operations are writes and the remaining proportion (1–w) of the operations are reads. The writes are temporarily stored in the write cache employing a fast write sequence. Then after a delay the write cache data is destaged with a reduced write stream due to the effects of writes overlaying previously stored data with an efficiency E. Typically the writes are spread evenly over the N data DASDs and can be represented by: (1–E)wt/N. The write data that is mapped to the multiple data DASDs 1–N can be written with one write operation to the mirror DASD 14.

In general, the reads are spread evenly among the data DASDs 1–N assuming that the read hits of the write cache 20 are negligible for performance calculations. The reads can be represented by: (1–w)t/N.

In order to keep the mirror DASD 14 from becoming a limiting factor in system performance, alternative approaches may be employed within the data processing system 10. For example, the write cache 20 can have a relatively large capacity to permit the use of data handling techniques that streamline data throughput and the required access time to the RAID 12. For example, the write cache 20 can have a capacity of 16 megabytes or greater. Also, the number N of data drives 1–N in the array 12 can be selected to limit the required access time for writing to the mirror DASD 14. Also data can be written to the data DASDs 1–N, then writing mirror data to the mirror DASD 14 carried out later during less busy periods of accesses to the RAID 12. This mirror data to be written out of synchronization with data written to the DASDs 1–N is marked in a nonvolatile memory for restoration later.

In another approach, the array controller 16 can turn off the mirror DASD 14 during times of expected high write activity and later turn it back on, including a restore by copying.

Figure 2B:
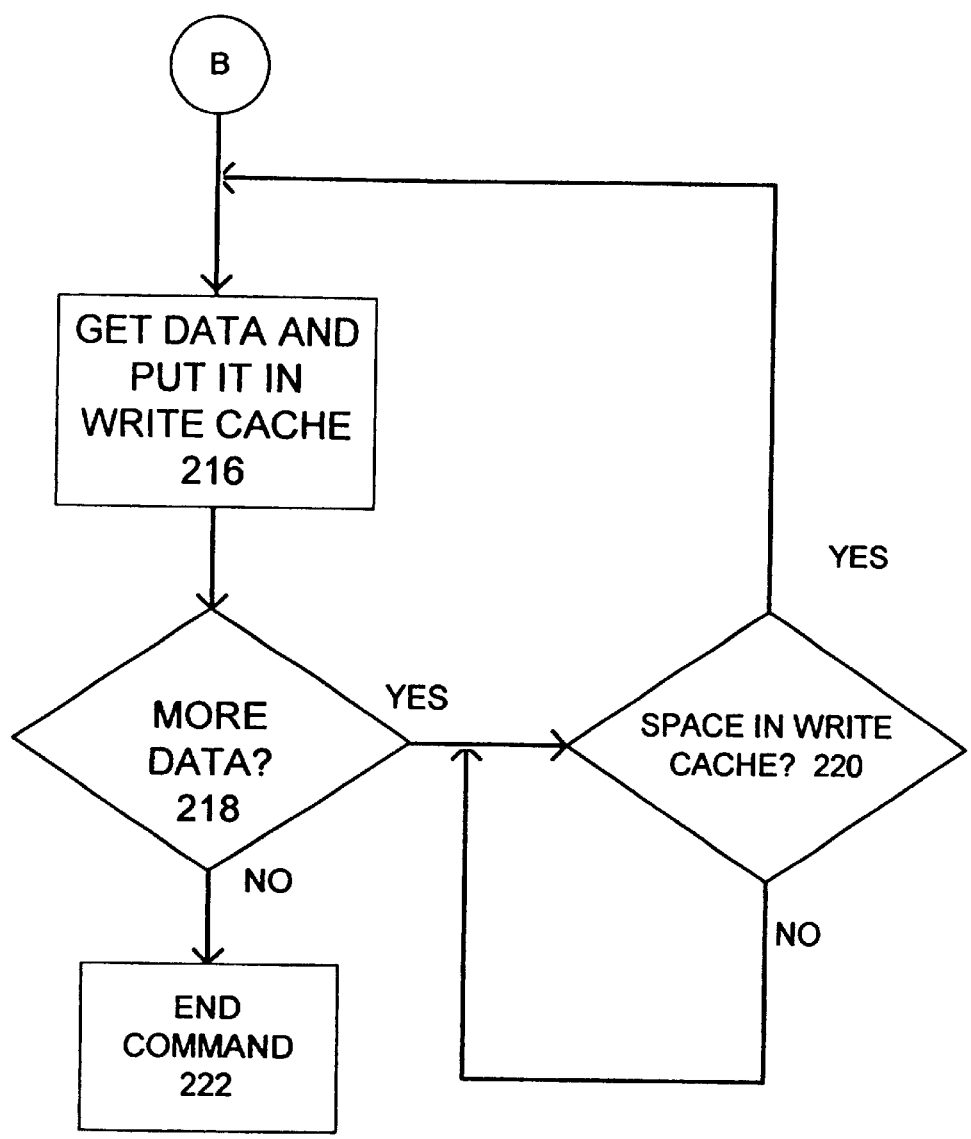

Having reference to FIGS. 2A and 2B, there are shown sequential machine operations for processing write commands. Initially a write command is received from the host processor 18 as indicated at a block 200. Array controller 16 determines whether space is available in the write cache 20 as indicated at a decision block 202. When space is not available in the write cache 20, then array controller 16 determines whether the wait queue is full as indicated at a decision block 204. When the wait queue is full, then array processor 16 signals the host processor 18 with an end command with queue full as indicated at a block 206. Otherwise, when the wait queue is not full; then array controller 16 puts the write command on the wait queue as indicated at a block 208. Next after space in write cache is identified at a decision block 210, the array controller identifies the turn for the write command as indicated at a decision block 212. After the turn for the write command is identified at decision block 212, then the write command is removed from the wait queue at a block 214.

Having reference to FIG. 2B, when available space in the write cache 20 is identified at decision block 202 or following removal of the command from the wait queue at block 214, then write data is supplied to the write cache 20 as indicated at a block 216. Array controller 16 checks for more data at a decision block 218. When more data is identified, array controller 16 waits for a data destage task to be completed with checking for available space in write cache as indicated at a decision block 220. The data destage task to move the data from the write cache 20 to the RAID 12 is illustrated and described with respect to FIGS. 3A and 3B. After a data destage provides available space in the write cache 20 identified at block 220, then remaining write data is supplied to the write cache 20 at block 216. Otherwise, when more data is not identified at block 218; a fast write completion or acknowledgement of completion of the write command is sent to the host processor 18 without waiting for the data to be written to the RAID 12. When more data is not identified at block 218, then array controller 16 sends an end command to the host processor 18 as indicated at a block 222.

Having reference to FIGS. 3A and 3B, there are shown sequential machine operations for processing write cache destage tasks by the array processor 16. Referring initially to FIG. 3A, a write cache destage task begins at a block 300. Initially data to destage or move from the write cache 20 to the RAID 12 is identified as indicated at a decision block 302. Then the write cache 10 is searched for destage data at higher addresses nearest the mirror drive arm and then is wrapped to the beginning of the drive if at end as indicated at a block 304. Next data drives DASD 1–N are calculated for receiving the destage data as indicated at a block 306. Then operation to write the destage data to the data DASDs begins as indicated at a block 308. Typically these writes are spread evenly among the data DASDs 1–N in the RAID 12.

Referring also to FIG. 3B, next it is determined whether the mirror DASD 14 is broken as indicated at a decision block 310. When the mirror DASD 14 is broken or a mirror drive failure is identified at block 310, data protection is suspended but the RAID 12 continues to operate at normal performance until the mirror DASD 14 is replaced. When the mirror DASD 14 is replaced, the data is read from the data DASDs 1–N and copied onto the mirror DASD 14. Performance of the RAID 12 is degraded until the copy is complete.

If determined at block 310 that the mirror DASD 14 is not broken, then the write operation to mirror DASD begins as indicated at a block 312. At a proximate time, the write data is written to the mirror DASD 14 in a manner which minimizes the service time of the mirror DASD 14 primarily by data mapping to permit seek optimization and data interleaving on the mirror DASD 14.

In one predefined operational mode of system 10 when one of the data DASDs 1–N has a fault condition, data protection with the mirror DASD 14 is suspended. The RAID 12 continues to operate at near normal performance because the array controller 16 uses the mirror DASD 14 to take over the function of the particular faulty data DASD. When the faulty data DASD is replaced, data is restored to it from the copy on the mirror DASD 14; and then the data is copied from the remaining ones of the data DASD 1–N which did not fail. Performance is degraded until the normal state is restored.

In an alternative operational mode for the RAID 12 when one of the data DASDs 1–N has a fault condition, protection is not suspended but the RAID 12 operates at reduced performance because the mirror DASD 14 takes over the function of the faulty one of the data DASDs 1–N as well as maintaining redundancy. When the faulty data DASD is replaced, data is restored to it from the copy on the mirror DASD 14. Performance is degraded until the normal state is restored.

Completed write operations are identified at a decision block 314. Then the destaged data space is made available as indicated at a block 316. Then the sequential operations return to decision block 302 in FIG. 3A to identify additional write data to destage.

Figure 4B:
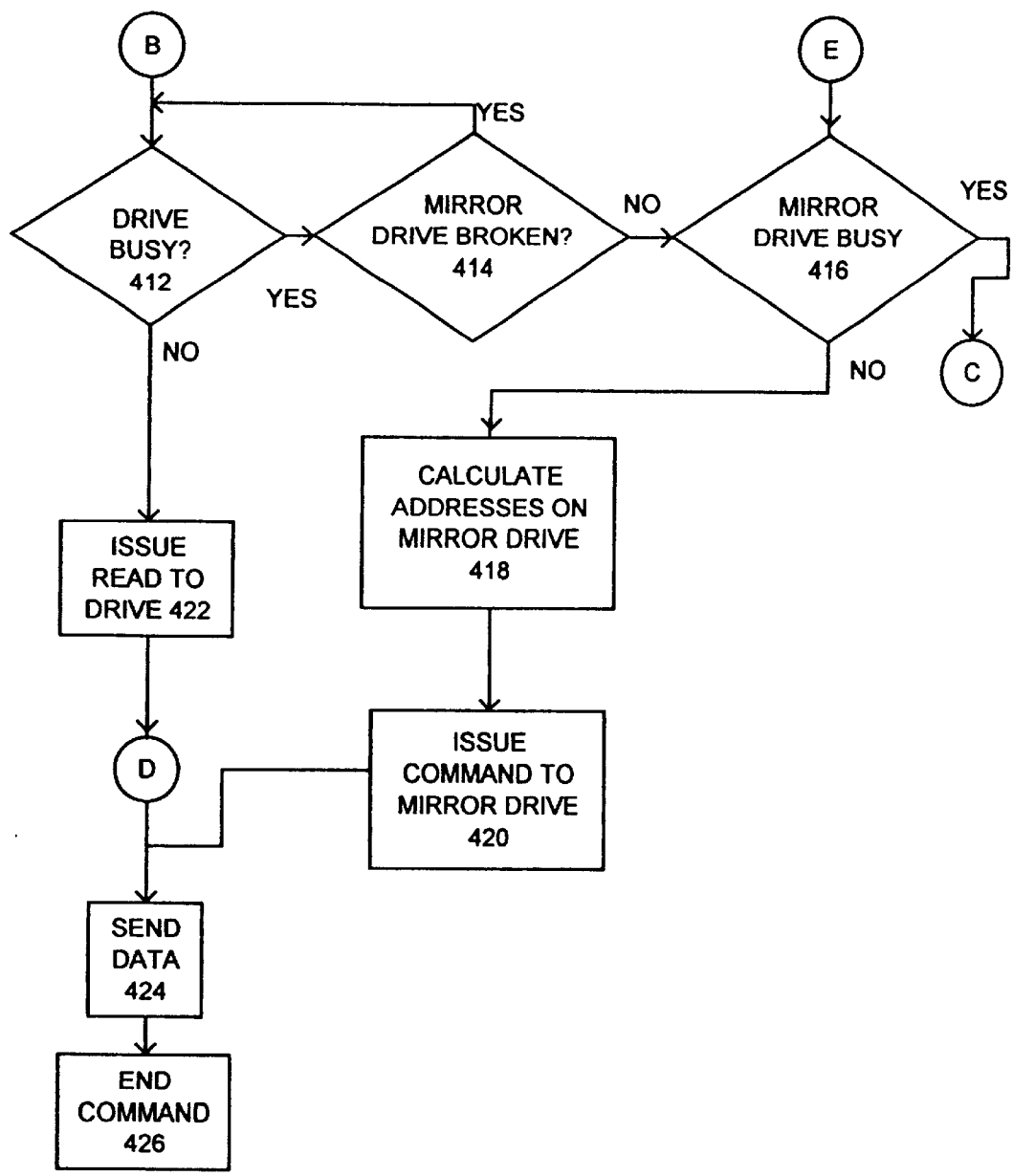

Having reference to FIGS. 4A, 4B and 4C, there are shown sequential machine operations for processing read commands received from the host processor 18. Array controller 16 receives a read command from the host processor 18 as indicated at a block 400. First it is determined whether all the read data is temporarily stored in the write cache 20 as indicated at a decision block 402. When all data is not in the write cache 20, the particular ones of the DASDs 1–N are calculated for the read data not stored in the write cache 20 as indicated at a block 404. Then it is determined whether a data DASD 1–N is marked as broken as indicated at a decision block 406. When a data DASD is identified as broken at decision block 406, then the array controller 14 checks whether the mirror DASD 14 is broken as indicated at a decision block 408. If the mirror DASD is identified as broken at block 408, then the array controller 16 exits the read command processing as indicated at a block 410.

Referring also to FIG. 4B, when a data DASD is not identified as broken at decision block 406, then the array controller 16 checks whether a calculated data drive for the data not stored in the write cache 20 is busy as indicated at a block 412. If a calculated data drive is busy, the array controller 16 determines whether the mirror drive 14 is broken as indicated at a decision block 414. When determined that the mirror drive 14 is broken at block 414, then the array controller 16 continues to check until the calculated data drive is not busy at block 412. If determined that the mirror drive 14 is not broken at block 414 or block 408 in FIG. 4A, then the array controller 16 checks whether the mirror drive 14 is busy as indicated at a decision block 416.

Next array controller 16 calculates the addresses for the read data on mirror drive 14 as indicated at a block 418. Then array controller 16 issues a read command to the mirror drive 14 as indicated at a block 420. Otherwise, when the calculated data drive for the data not in the write cache 20 is not busy, then the array controller 16 issues a read command to the calculated data drive as indicated at a block 422. Then the read data from the write cache at block 402 in FIG. 4A, from the data drive at block 422 or from the mirror drive at block 420 and an end command are sent to the host processor 18 as indicated at blocks 424 and 426.

Referring also to FIG. 4C, when determined that the mirror drive is busy at block 416 in FIG. 4B, then array controller 16 determines whether the wait queue is full as indicated at a decision block 428. If the wait queue is full, then array controller 16 sends an end command with queue full as indicated at a block 430. Otherwise when the wait queue is not full, then array controller 16 puts the read command on the wait queue as indicated at a block 432. Next array controller 16 checks for another command to finish as indicated at a decision block 434. Array controller 16 removes the command from wait queue as indicated at a block 436. Then the sequential operation return to check whether a calculated data drive is busy at block 412 in FIG. 4B.

While the invention has been described with reference to details of the illustrated embodiment, these details are not intended to limit the scope of the invention as defined in the appended claims.

What is claimed is:

1. A method for processing data in data processing system including a redundant array of independent disk drives (RAID) operatively controlled by an array controller comprising the steps of:
   providing a plurality of data drives and a single predefined mirror drive in the RAID; said single predefined mirror drive having a set capacity substantially greater than a capacity of each of said plurality of data drives;
   writing data to multiple data drives in the RAID;
   writing a mirror copy of said written data to said predefined mirror drive in the RAID; and
   reading data from said multiple data drives.

2. A method for processing data in data processing system including a redundant array of independent disk drives (RAID) as recited in claim 1 further includes the step of:
   temporarily storing write command data to a write cache; and
   wherein said steps of writing data to multiple data drives and writing a mirror copy to said single predefined mirror drive in the RAID include the step of destaging data from said write cache.

3. A method for processing data in data processing system including a redundant array of independent disk drives (RAID) as recited in claim 1 wherein said step of reading data from said multiple data drives includes the steps of:
   identifying a busy or failed data drive; and
   reading data from said single predefined mirror drive in the RAID.

4. A method for processing data in data processing system including a redundant array of independent disk drives (RAID) as recited in claim 1 further includes the step of:

calculating data drives for writing data and identifying a failed data drive;

writing data for said failed data drive to said single predefined mirror drive in the RAID.

5. A method for processing data in data processing system including a redundant array of independent disk drives (RAID) as recited in claim 2 wherein said step of writing data to multiple data drives in the RAID includes the step of:

searching the write cache for destage data at higher addresses nearest a drive arm of said single predefined mirror drive;

writing said destage data to said multiple data drives; and allocating the destage data space in write cache as available.

6. A data processing system including a redundant array of independent disk drives (RAID) operatively controlled by an array controller, said array controller comprising:

means for assigning a plurality of data drives and a single predefined mirror drive in the RAID; said single predefined mirror drive having a set capacity substantially greater than a capacity of each of said plurality of data drives;

means for writing data to said plurality data drives in the RAID;

means for writing a mirror copy of said written data to said single predefined mirror drive in the RAID; and means for reading data from said multiple data drives.

7. A data processing system as recited in claim 6 includes a write cache for temporarily storing write command data.

8. A data processing system as recited in claim 6 includes means for identifying a failed data drive and means for writing data for said identified failed data drive to said predefined mirror drive.

9. A data processing system as recited in claim 6 wherein said single predefined mirror drive has a predefined capacity greater than or equal to a sum of the capacity of said plurality of data drives.

10. A data processing system as recited in claim 6 includes means for identifying a failed data drive and means for reading data from said single predefined mirror drive.

11. Apparatus for processing data in data processing system including a redundant array of independent disk drives (RAID) comprising:

a plurality of data drives in the RAID;

a single predefined mirror drive in the RAID; said single predefined mirror drive having a predefined capacity greater than or equal to a sum of the capacity of the plurality of data drives;

array controller means for operatively controlling operation of the RAID including;

means for writing data to multiple data drives in the RAID;

means for writing a mirror copy of said written data to said predefined mirror drive in the RAID;

means for reading data from said multiple data drives; and means for identifying a failed one of said multiple data drive and for reading data from said predefined mirror drive.

12. Apparatus as recited in claim 11 further includes a write cache for temporarily storing write command data.

* * * * *